(12) United States Patent
Watanabe

(10) Patent No.: US 9,972,973 B2
(45) Date of Patent: May 15, 2018

(54) PROCESS OF FORMING SEMICONDUCTOR OPTICAL DEVICE AND SEMICONDUCTOR OPTICAL DEVICE

(71) Applicant: SUMITOMO ELECTRIC DEVICE INNOVATIONS, INC., Yokohama (JP)

(72) Inventor: Takayuki Watanabe, Yokohama (JP)

(73) Assignee: Sumitomo Electric Device Innovations, Inc., Yokohama (JP)

( * ) Notice: Subject to any disclaimer, the term of this patent is extended or adjusted under 35 U.S.C. 154(b) by 0 days. days.

(21) Appl. No.: 15/405,998

(22) Filed: Jan. 13, 2017

(65) Prior Publication Data
US 2017/0207604 A1 Jul. 20, 2017

(30) Foreign Application Priority Data
Jan. 14, 2016 (JP) ................. 2016-005432

(51) Int. Cl.
| H01S 5/00 | (2006.01) |
| H01S 5/227 | (2006.01) |
| H01S 5/30 | (2006.01) |
| H01S 5/343 | (2006.01) |
| H01L 21/02 | (2006.01) |

(Continued)

(52) U.S. Cl.
CPC ........ H01S 5/2277 (2013.01); H01L 21/0262 (2013.01); H01L 21/02543 (2013.01); H01L 21/02636 (2013.01); H01S 5/2272 (2013.01); H01S 5/2275 (2013.01); H01S 5/305 (2013.01); H01S 5/3013 (2013.01); H01S 5/3202 (2013.01); H01S 5/3434 (2013.01); *H01S 5/0422* (2013.01); *H01S 5/0425* (2013.01); *H01S 5/2224* (2013.01); *H01S 5/2226* (2013.01); *H01S 5/3054* (2013.01); *H01S 5/3213* (2013.01); *H01S 5/34306* (2013.01);

(Continued)

(58) Field of Classification Search
CPC ...... H01S 5/2277; H01S 5/3434; H01S 5/305; H01S 5/2272; H01S 5/3013
See application file for complete search history.

(56) References Cited

U.S. PATENT DOCUMENTS 5,528,617 A * 6/1996 Kobayashi ............ H01S 5/2231
                                                                   372/45.01
6,512,783 B1  1/2003 Yamamoto et al.
(Continued)

FOREIGN PATENT DOCUMENTS

JP          H05-55696 A          3/1993

*Primary Examiner* — Yuanda Zhang
(74) *Attorney, Agent, or Firm* — Venable LLP; Michael A. Sartori; Miguel A. Lopez

(57) ABSTRACT

A semiconductor laser diode type of a buried-hetero structure (BH-LD) is disclosed. The LD provides a mesa, a first burying layer, and a second burying layer, where the burying layers are provided in respective sides of the mesa so as to expose a top of the mesa. The mesa includes a lower cladding layer, an active layer, and an upper cladding layer, where the cladding layers have conduction type opposite to each other and, combined with the burying layers, constitute a carrier confinement structure. The second burying layer has an even surface overlapping with an even surface of the first burying layer, and has a thickness in a portion of the even surface that is thinner than a thickness thereof in a portion except for the even surface.

18 Claims, 11 Drawing Sheets

(51) Int. Cl.
  *H01S 5/32* (2006.01)
  *H01S 5/042* (2006.01)
  *H01S 5/22* (2006.01)

(52) U.S. Cl.
  CPC ..... *H01S 2301/176* (2013.01); *H01S 2304/04* (2013.01)

(56) References Cited

U.S. PATENT DOCUMENTS

| | | | |
|---|---|---|---|
| 2002/0111034 A1* | 8/2002 | Watanabe | H01L 21/30617 438/745 |
| 2003/0012240 A1* | 1/2003 | Yamamoto | B82Y 20/00 372/46.01 |
| 2014/0302628 A1* | 10/2014 | Takeuchi | H01S 5/2227 438/39 |

* cited by examiner

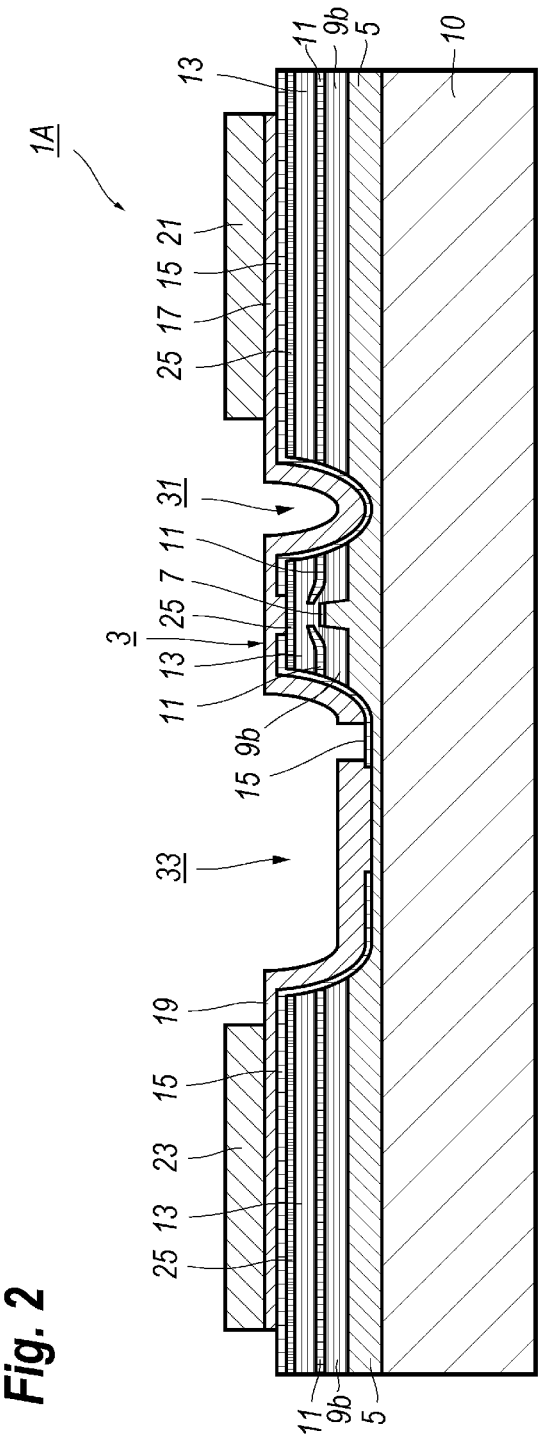

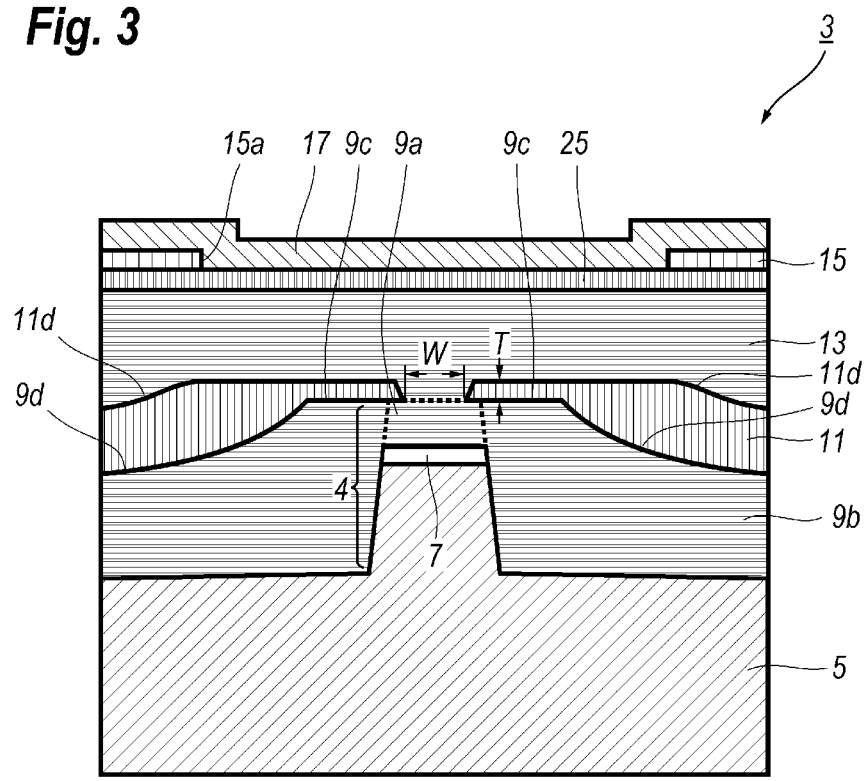

PROCESS OF FORMING SEMICONDUCTOR OPTICAL DEVICE AND SEMICONDUCTOR OPTICAL DEVICE

BACKGROUND

1. Field of the Invention

The present invention relates to a process of forming a semiconductor optical device type of semiconductor laser diode (LD) and an LD formed thereby.

2. Background Arts

Various prior documents have reported processes of forming an LD of the type of, what is called, a buried heterostructure (BH). A typical process for a BH-LD includes steps of: (a) preparing a semiconductor stack that includes a lower cladding layer, an active layer, and an upper cladding layer; (b) forming a mesa by etching portions of the lower cladding layer, the active layer, and the upper cladding layer with a striped mask extending along a direction; (c) selectively growing a first burying layer so as to bury the mesa; (d) exposing a top of the mesa by partially melting the first burying layer; (e) growing a second burying layer on the first burying layer and the exposed top of the mesa; (f) exposing the top of the mesa by partially melting the second burying layer; and (g) growing the third cladding layer on the exposed top of the mesa, which exposes the upper cladding layer, and on the second burying layer. Opposing the conduction type of the lower cladding layer to the conduction type of the upper cladding layer, and matching the conduction type of the lower cladding layer with that of the second burying layer, and also matching that of the first burying layer with that of the upper cladding layer and the third cladding layer, a current confinement structure of the BH-LD may be formed.

As accelerating transmission speed in the optical communication system, an LD implemented therein has been strongly requested to be operable in high speed and to show excellent emission efficiency. In order to enhance the emission efficiency, an LD is necessary to reduce parasitic resistance and increase carrier confinement into the active layer. The carrier confinement in a BH-LD may be realized by narrowing a window formed by the burying layers above the mesa, which means that the upper cladding layer and/or the third cladding layer above the upper cladding layer inevitably increases parasitic resistance thereof. Enhancement of doping density by p-type impurities into the upper cladding layer and/or the third cladding layer above the upper cladding layer may reduce the parasitic resistance but zinc (Zn) atoms, which are typical p-type dopant for the cladding layers, show faster diffusion velocity. Zincs diffused into the active layer easily form non-radiative recombination centers, which degrades the emission efficiency of a BH-LD. Accordingly, an arrangement for reducing the parasitic resistance of a BH-LD except for increasing doping density of Zn has been demanded in the field.

SUMMARY OF INVENTION

A first aspect of the present invention relates to a process of forming a semiconductor optical device. The process includes steps of: (a) forming a mesa; (b) burying the mesa by selectively growing the first burying layer; and (c) growing the second burying layer on the first burying layer and a top of the mesa. The mesa includes a lower cladding layer having a first conduction type, an active layer, and an upper cladding layer having a second conduction type opposite to the first conduction type; and exposes a surface of the lower cladding layer in respective sides thereof. The first burying layer, which has the second conduction type and covers the respective sides of the mesa, has an even surface and another surface. The even surface is next to the mesa, and the another surface is apart from the mesa so as to put the even surface therebetween. The even surface has a surface orientation that reflects a surface orientation of surface of the lower cladding layer exposed in the respective sides of the mesa at the step of forming the mesa; and has a level that is higher than a level of the active layer in the mesa. The second burying layer, which is grown at a relatively lower temperature of 540 to 580° C., has also an even surface and another surface. The even surface of the second burying layer, which overlaps with the even surface of the first burying layer and has a surface orientation substantially equal to the surface orientation of the even surface of the first burying layer, has a thickness in a portion of the even surface of the first burying layer that is thinner than another thickness thereof in a portion of the another surface of the first burying layer.

A second aspect of the present invention relates to an arrangement of a semiconductor optical device type of semiconductor laser diode with a buried hetero structure (BH-LD). The BH-LD includes a mesa, a first burying layer, and a second burying layer. The mesa includes a portion of a lower cladding layer with a first conduction type, an active layer, and an upper cladding layer with a second conduction type opposite to the first conduction type, where the lower cladding layer has a surface with a surface orientation in a portion except for the mesa. The first burying layer, which is provided in respective sides of the mesa, has an even surface and another surface. The even surface has a surface orientation thereof substantially equal to the surface orientation of the surface of the lower cladding layer, while, the another surface has surface orientations with indices higher than an index of the even surface. The second burying layer, which covers the first burying layer but exposes a top of the mesa, has an even surface and another surface. The even surface of the second burying layer, which overlaps with even surface of the first burying layer, has a surface orientation substantially equal to the surface orientation of the even surface of the lower cladding layer, while, the another surface of the second burying layer has surface orientations with indices thereof higher than an index of the even surface of the second burying layer. A feature of the arrangement of the BH-LD of the present invention is that the second burying layer has a thickness in the even surface thereof that is thinner than a thickness in the another surface thereof.

DESCRIPTION OF DRAWINGS

The foregoing and other purposes, aspects and advantages will be better understood from the following detailed description of a preferred embodiment of the invention with reference to the drawings, in which:

FIG. 2 shows a cross section of the semiconductor optical device taking along the line II-II indicated in FIG. 1;

FIG. 3 shows a cross section of a primary portion of the semiconductor optical device shown in FIG. 2;

DESCRIPTION OF EMBODIMENT

Next, some embodiments according to the present invention will be described as referring to accompanying drawings. In the description of the embodiments, numerals or symbols same with or similar to each other will refer to elements same with or similar to each other without duplicating explanations.

Figure 1:
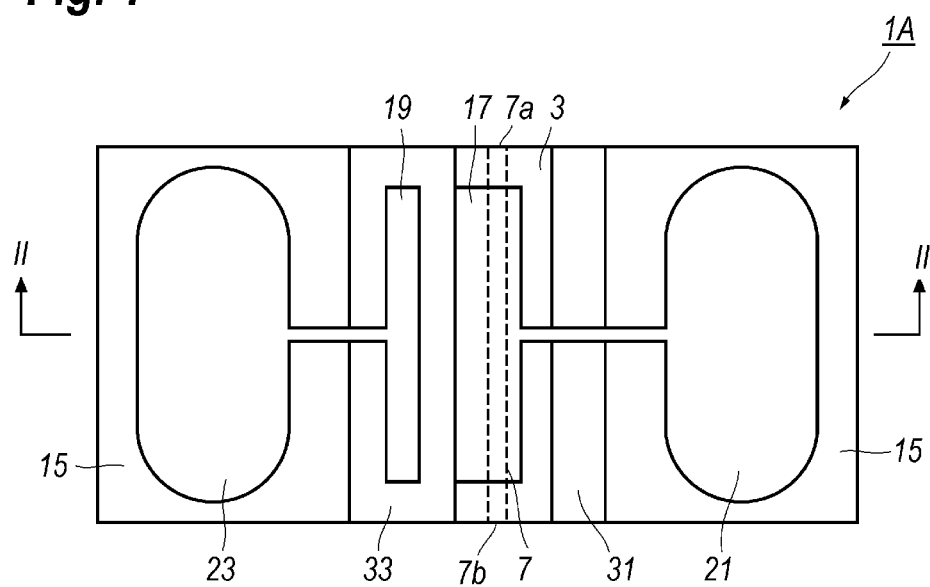
FIG. 1 is a plan view of a semiconductor optical device according to embodiment of the present invention.

A semiconductor optical device of the embodiment is a type of semiconductor laser diode (LD) having a buried hetero-structure. FIG. 1 is a plan view of the optical device 1A, and FIG. 2 shows a cross section of the optical device 1A taken along the line II-II indicated in FIG. 1. The optical device 1A, as FIGS. 1 and 2 illustrate, provides a semiconductor stack formed on a substrate 10, where the semiconductor stack provides two trenches, 31 and 33, extending parallel so as to leave a primary portion 3 therebetween. The primary portion 3 includes an active layer 7 extending along the trenches, 31 and 33, and in respective ends thereof so as to form facets, 7a and 7b, that form an optical cavity causing a laser oscillation therebetween.

The optical device 1A provides a pad 21, which may be an anode electrode of the LD, so as to place the trench 31 with respect to the primary portion 3. Supplying carriers, electrons or holes, in the pad 21 through bonding wires, the anode electrode provided in the primary portion 3 may be electrically connected to an external. Similarly, the LD 1A provides another pad 23 so as to place the other trench 33 with respect to the primary portion 3. The pad 23 is connected to a cathode electrode of the primary portion 3. Wire-bonding to the pad 23, the cathode in the primary portion 3 may be electrically connected to the external.

FIG. 3 magnifies the primary portion 3 by showing a cross section thereof. The primary portion 3 comprises a mesa 4, a first burying layer 9b, a second burying layer 11, a third cladding layer 13, and a contact layer 25, where the mesa 4 includes a lower cladding layer 5, the active layer 7, and the upper cladding layer 9a. The lower cladding layer 5, the active layer 7, and the upper cladding layer 9a are sequentially grown on the substrate 10 in this order. The substrate 10 may have an n-type conduction, for instance, the substrate may be made of an n-type InP doped with tin (Sn) by density of $1.0\times10^{18}/cm^3$. The substrate 10 in a primary surface thereof on which the crystal growth is going to be carried out, provides a (100) surface orientation. The lower cladding layer 5, which has the conduction type same with that of the substrate 10, may be made of an n-type InP doped with silicon (Si) by density of $1.0\times10^{18}/cm^3$. The lower cladding layer 5 may have a thickness of 200 to 2000 nm. The active layer 7, which has bandgap wavelength shorter than that of the lower cladding layer 5, that is, the bandgap energy of the active layer 7 is greater than that of the lower cladding layer 5, may have a structure of multiple quantum well (MQW) made of InGaAsP or other materials involved in the InGaAsP group. The active layer 7 has a thickness of 100 to 300 nm. The upper cladding layer 9a, which has a conduction type opposite to that of the lower cladding layer 5, may be made of p-type InP doped with zinc (Zn) by density of $1.0\times10^{18}/cm^3$. The upper cladding layer 9a may have a thickness of 100 to 300 nm. The mesa 4 is formed by partially etching those layers of the lower cladding layer 5, the active layer 7, and the upper cladding layer 9a. The mesa 4 has a height of, for instance, 1.5 to 2.0 μm. The top surface of the lower cladding layer 5 exposed by the process of forming the mesa 4, the top surface of the lower cladding layer 5 within the mesa 4, the top surface of the active layer 7 in the mesa 4, and the top surface of the upper cladding layer 9a all have the surface orientation equal to the top surface of the substrate 10. That is, those top surfaces reflect the surface orientation of the substrate 10 and become the (100) surface orientation.

The first burying layer 9b has the second conduction type, namely, p-type in the present embodiment, or may be made of semiconductor layer with excellently high resistivity or semi-insulating semiconductor material. When the first burying layer 9b is the type of the high-resistivity semiconductor layer, the first burying layer 9b may be doped with impurities forming deep acceptors. Such impurities are iron (Fe), titanium (Ti), cobalt (Co), and so on. An InP doped with iron (Fe) by density of $7.0\times10^{16}/cm^3$ is applicable to the first burying layer 9b. While, an InP doped with zinc (Zn) by density of $5.0\times10^{17}/cm^3$ is also applicable to the first burying layer 9b as a material having the second conduction type (p-type). The first burying layer 9b is formed in respective sides of the mesa 4 so as to cover sides of the lower cladding layer 5 and the active layer 7. The first burying layer 9b of the present embodiment further covers the sides of the upper cladding layer 9a in addition to those of the lower cladding layer 5 and the active layer 7. The first burying layer 9b in a top level thereof is necessary to be higher than a level of the active layer 7.

The second burying layer 11, which has the conduction type same with that of the substrate 10 and the lower cladding layer 5, may be made of n-type InP doped with sulfur (S) by density of $1.0\times10^{19}/cm^3$. The second burying layer 11 is provided on and in contact to the first burying layer 9b. When the first burying layer 9b has the second conduction type (p-type), the first burying layer 9b and the second burying layer 11 cause a reverse biased p-n junction at the interface therebetween. The interface between the two burying layers, 9b and 11, further forms an even surface 9c in respective sides of the mesa 4. The even surface 9c also provides a surface orientation same with that of the top surface of the lower cladding layer 5 exposed by the etching for forming the mesa 4. The even surface 9c in the level thereof is higher than the active layer 7 but lower than the top of the mesa 4. When the even surface 9c in the level thereof is substantially equal to the top of the mesa 4, the even surface 9c smoothly continues to the top of the mesa 4 so as to form a unique plane. As explained later in the present specification, the second burying layer 11 in portions on the even surface 9c provides an even surface 11c and another surface 11d except for the even surface 11c. The second burying layer 11 has a thickness in the portion of the even surface 11c thereof that is thinner than thicknesses in portions of the another surface 11d against the surface the another surface 9d except for the even surface 9c of the first burying layer 9b, where those surfaces, 9d and 11d, except for the even surface 9c and the even surface 11c, respectively, usually show the surface orientations with higher indices, for instance (311), (411) and so on. In an example, the second burying layer 11 in the portion of the even surface 11c thereof on the even surface 9c has a thickness T thinner than a quarter of thicknesses at the surface 11d against the surface 9d, which may be typically 50 to 300 nm.

The second burying layer 11 in respective ends thereof runs up onto the mesa 4. Specifically, the second burying layer 11 in the respective ends thereof cover portions of the top of the mesa 4 passing the edges of the mesa 4, which narrows a window of a current path to the active layer 7 so as to be smaller than a top width of the mesa 4. The width W of the current path may be, for instance, 0.5 μm. The second burying layer 11 in portions extending into the top of the mesa 4 has a thickness substantially equal to a thickness T in the even surface 9c of the first burying layer 9b.

The third cladding layer 13, which has the second conduction type, may be made of material identical with that of the upper cladding layer 9a. For instance, the third cladding layer 13 may be made of p-type InP doped with zinc (Zn) by density of $1.2 \times 10^{18}/cm^3$ and has a thickness of 2.0 μm. Provided on the third cladding layer 13 is the contact layer 25, which may be made of material having the bandgap energy smaller than that of the third cladding layer 13. The contact layer 25 of the present embodiment may be made of p-type InGaAsP doped with zinc (Zn) by density of $1.5 \times 10^{19}/cm^3$ with a thickness of 0.5 μm. The contact layer 25 is provided on and in contact to the third cladding layer 13.

Provided on the contact layer 25 is the insulating layer 15 that covers a whole of the primary portion 3. The insulating layer 15 may be made of electrically insulating silicon compound, such as silicon nitride (SiN), silicon oxide ($SiO_2$), and so on. Provided on the insulating layer 15 is the metal layer 17 that may be primarily made of gold (Au). The insulating layer 15 provides an opening 15a above the mesa 4. The metal layer 17 is electrically in contact to the contact layer 25 through the opening 15a.

Referring to FIGS. 1 and 2 again, the insulating layer 15 described above not only covers the primary portion 3 but covers a whole of the substrate 10 including the trenches, 31 and 33. The metal layer 17 reaches the pad 21 from the top of the primary portion 3 passing the side and the bottom of the trench 31, exactly, the metal layer 17 lays beneath the pad 21. Another metal layer 19, which may be primarily made of gold (Au), is also provided on the insulating layer 15. The insulating layer 15 provides another opening in the bottom of the trench 33 through which the metal layer 19 is in contact to the substrate 10. The metal layer 19 reaches the pad 23, exactly, beneath of the pad 23, from the bottom of the trench 33. Thus, the metal layers, 17 and 19, show a function of an undercoating for the pads, 21 and 23, when they are formed on the insulating layer 15.

Next, a process of forming the optical device 1A thus configured will be described as referring to FIGS. 4 to 6 which show cross section of the optical device 1A at respective steps.

Figure 4A:
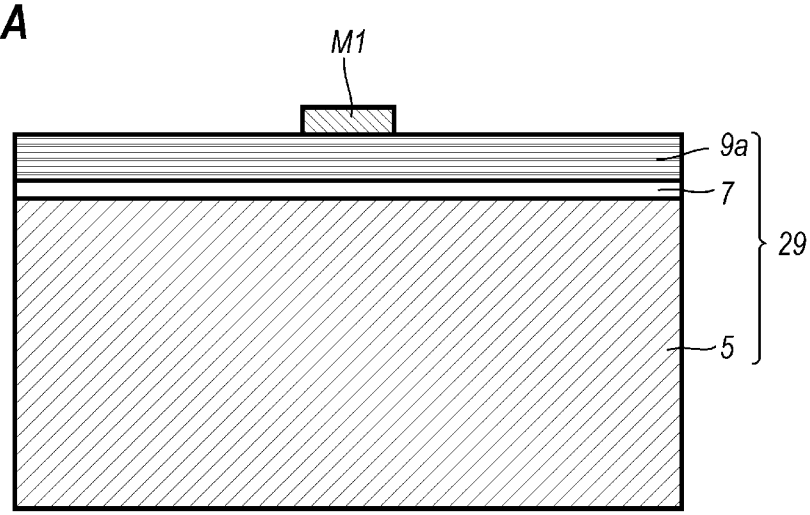
FIGS. 4A and 4B show processes of forming the semiconductor optical device.
Figure 5A:
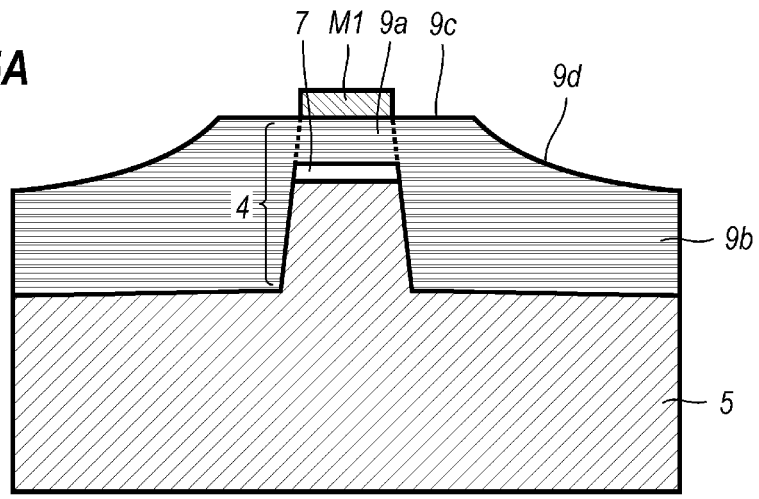
FIGS. 5A and 5B show processes of forming the semiconductor optical device.

First, as shown in FIG. 4A, the process forms a semiconductor stack 29 on the substrate 10 by sequentially growing a lower cladding layer 5, an active layer 7, and an upper cladding layer 9a. Then, a mask M1, which may be made of electrically insulating silicon compound, typically, silicon di-oxide ($SiO_2$) is prepared on the semiconductor stack 29. The mask M1 has a plane shape corresponding to a plane shape of the mesa 4.

Figure 4B:
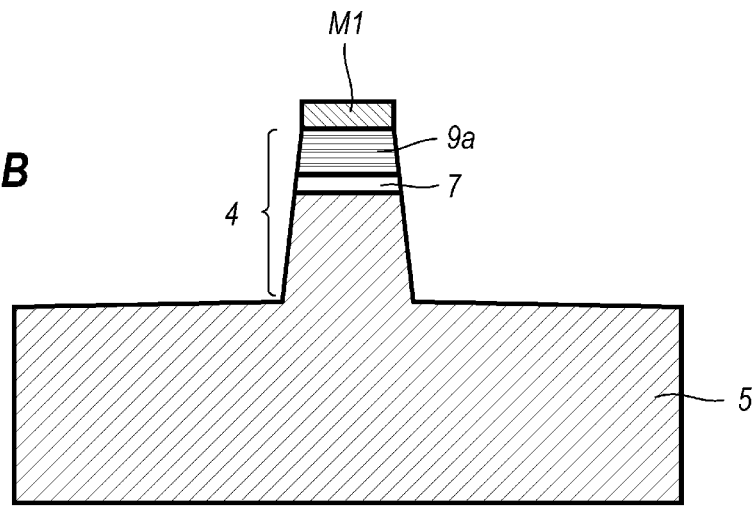

Next, the process forms the mesa 4 by etching portions of the upper cladding layer 9a, the active layer 7, and the lower cladding layer 5 exposed from the mask M1. The etching may be carried out by, what is called, dry-etching using a reactive gas containing silicon tetra-chloride ($CCl_4$). The etching in this step is stopped halfway in the lower cladding layer 5 as shown in FIG. 4B. Then, leaving the mask M1, the process selectively grows the first burying layer 11b on the first cladding layer 5 exposed in both sides of the mesa 4. The first burying layer 9b covers at least the respective sides of the lower cladding layer 5 and those of the active layer 7. When the first burying layer 9b has the p-type conduction, typically, a p-type InP, the growth temperature and the growth pressure thereof are a range of 540 to 630° C. and a range from $4.0 \times 10^3$ Pa to $2.67 \times 10^4$ Pa. Also, a ratio of the flow rate of phosphide source ($F_P$) against the flow rate of indium source ($F_{In}$), namely $F_P/F_{In}$, may be a range of 50 to 150. Under such growth conditions, the first burying layer 9b grown thereby may have even surfaces 9c in the respective sides of the mesa 4 having a surface orientation reflecting the surface orientation of the lower cladding layer 5 exposed in the respective sides of the mesa 4, which is for instance the (100) surface orientation; and other surface 11d having surface orientations of higher indices, such as (311), (411), and so on, in respective outsides of the even surface 9c.

Figure 5B:
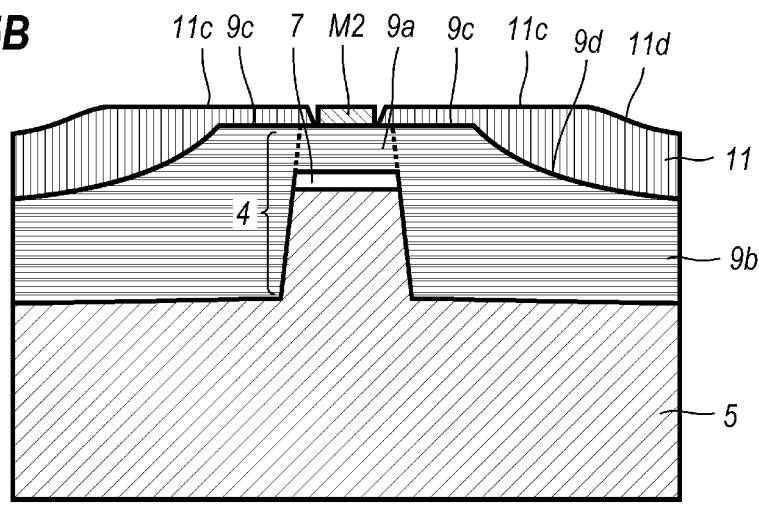

Partly etching the mask M1 by, for instance, buffered fluoric acid (BHF) so as to retreat edges thereof, the process prepares another mask M2 with a width narrower than that of the former mask M1, as FIG. 5B illustrates. Then, the second burying layer 11 may be selectively grown on the first burying layer 9b exposed from the mask M2. A feature of the process according to the present invention is that the growth rate of the second burying layer 11 on the even surface 9c of the first burying layer 9b closer to the mesa 4 is slower than the growth rate thereof on the surface 9d of the first burying layer 9b. For instance, when the first burying layer 9b in the even surface 9c closer to the mesa 4 has the (100) plane orientation reflecting the lower cladding layer 5, the second burying layer 11 may be grown by conditions of: the growth temperature of 540 to 580° C., the growth pressure of 6.67 kPa (50 Torr) to 26.7 kPa (200 Torr), and a ratio of the flow rate $F_P$ of the phosphide (P) source against the flow rate $F_{IN}$ of the indium (In) source, $F_P/F_{IN}$, of 50 to 150. Under such conditions, the second burying layer 11 made of InP shows the growth rate on the first burying layer 9b with the (100) surface orientation becomes quarter or less of the growth rate on the first burying layer 9b with the surface orientations of higher indices of (311), (411) and so on.

Because the mask M2 has the width narrower than that of the mask M1, the second burying layer 11 may grow not only on the first burying layer 9b but on the top of the mesa 4 so as to expand on the top of the mesa 4, which may make the current flowing path narrower than a width of the mesa 4. That is, this arrangement of the second burying layer 11 may effectively reduce the ineffective current leaking along the sides of the mesa 4.

Figure 6A:
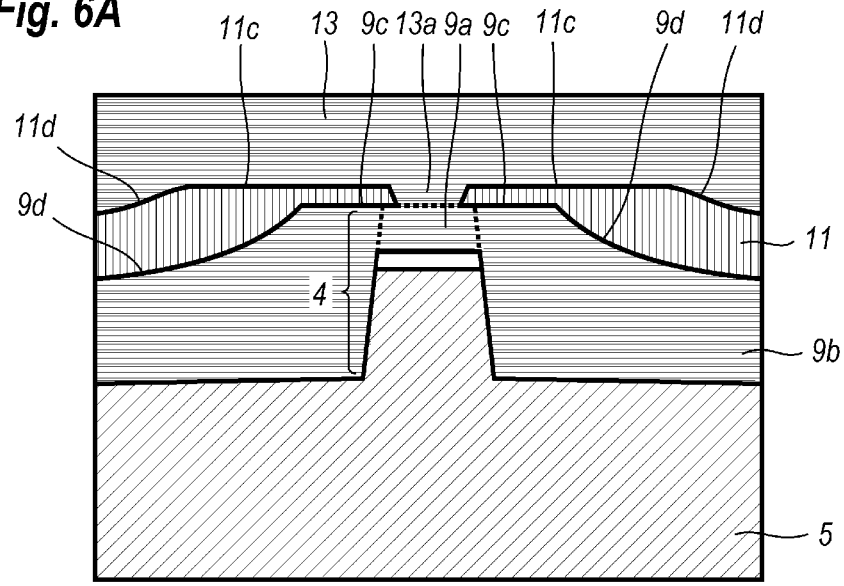
FIGS. 6A and 6B show processes of forming the semiconductor optical device.
Figure 6B:
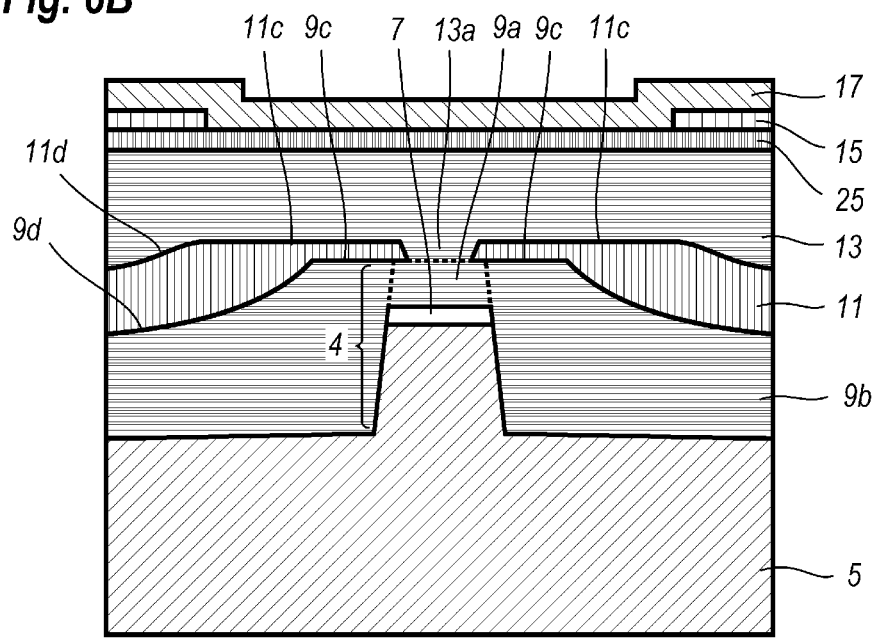

Next, the process grows the third cladding layer 13 on the second burying layer 11 and the mesa 4 as FIG. 6A illustrates, and then grows the contact layer 25 on the third cladding layer 13 as shown in FIG. 6B. Forming the trenches, 31 and 33, depositing the insulating layer 15, and forming the openings, 15a and 15b, in the insulating layer 15; the process forms the metal layers, 17 and 19, and the pads, 21 and 23, on the respective metal layers, 17 and 19. Thus, the process of forming the optical device 1A is completed.

The process thus described may grow the semiconductor layers by the metal organic vapor phase epitaxy (MOVPE)

technique. The MOVPE technique may use tri-methylethylene (TMA) and phosphine as source materials for indium (In) and phosphide (P). Di-methyl zinc and ferrocene may be used as p-type dopants of zinc (Zn) and iron (Fe). On the other hand, hydrogen sulfide ($H_2S$) and di-silane ($Si_2H_6$) may be used as n-type dopants of sulfur (S) and silicon (Si).

The optical device 1A and the method of forming the optical device 1A thus described have various advantageous. The first advantage is that the first burying layer 9b in the top surface thereof includes the even surface 9c in the respective sides of the mesa 4, where the even surface 9c has the top level thereof higher than that of the active layer 7. Accordingly, the second burying layer 11 formed on the first burying layer 9b may effectively confine carriers within the active layer 7, which may enhance the efficiency of the conversion from the carriers to the photons.

Figure 11:
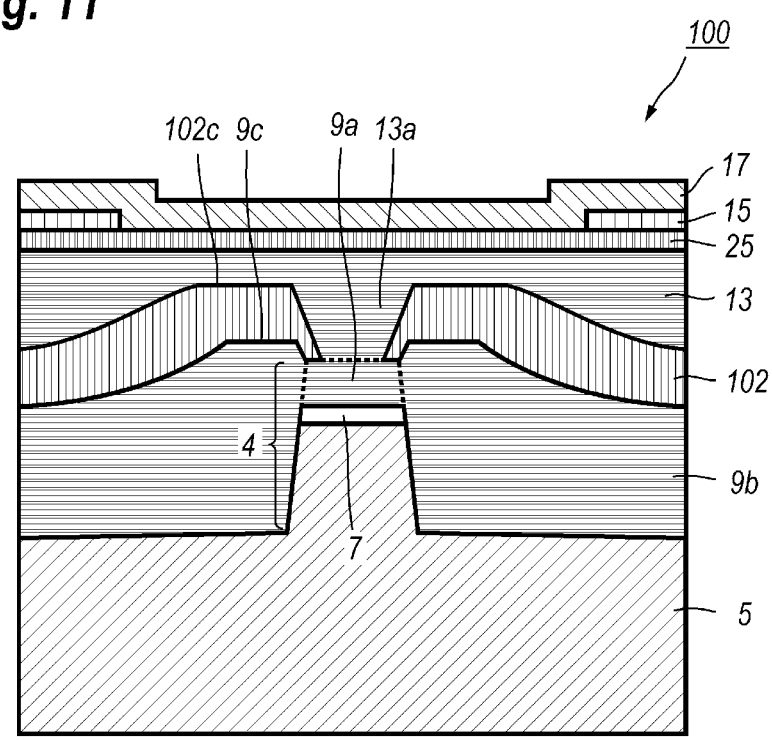
FIG. 11 shows a cross section of a conventional semiconductor optical device.

FIG. 11 shows a cross section of a conventional BH-LD 100, whose arrangements should be comparable to those of the present invention. That is, the conventional BH-DB 100 provides the second burying layer 102 having an even thickness in a portion closer to the mesa 4 and a rest portion apart from the mesa 4, which results in a thicker third cladding layer 13a on the top of the mesa 4. In other words, the thicker second burying layer 102 in the top of the mesa 4 results in an prolonged current path in the third cladding layer 13, by which parasitic resistance between the upper electrode to the active layer 7 is increased and the emission efficiency is degraded.

On the other hand, the present invention lowers the growth rate of the second burying layer on the portion of the even surface 9c thereof compared with the growth rate on the surface 9d except for the even surface 9c. Accordingly, the second burying layer 11 has the thinned region 11c on the even surface 9c of the first burying layer 9b, which means the current confinement region 13a of the third burying layer 13 becomes thinner compared with that 13a of the conventional device 100 and shortens the current flowing path. Thus, the parasitic resistance of the device 1A may be reduced. Also, the second burying layer 11 may be formed thicker on the other surface 9d except for the even surface 9c in the first burying layer 9b, the carriers may be effectively confined within the mesa 4.

Figure 7:
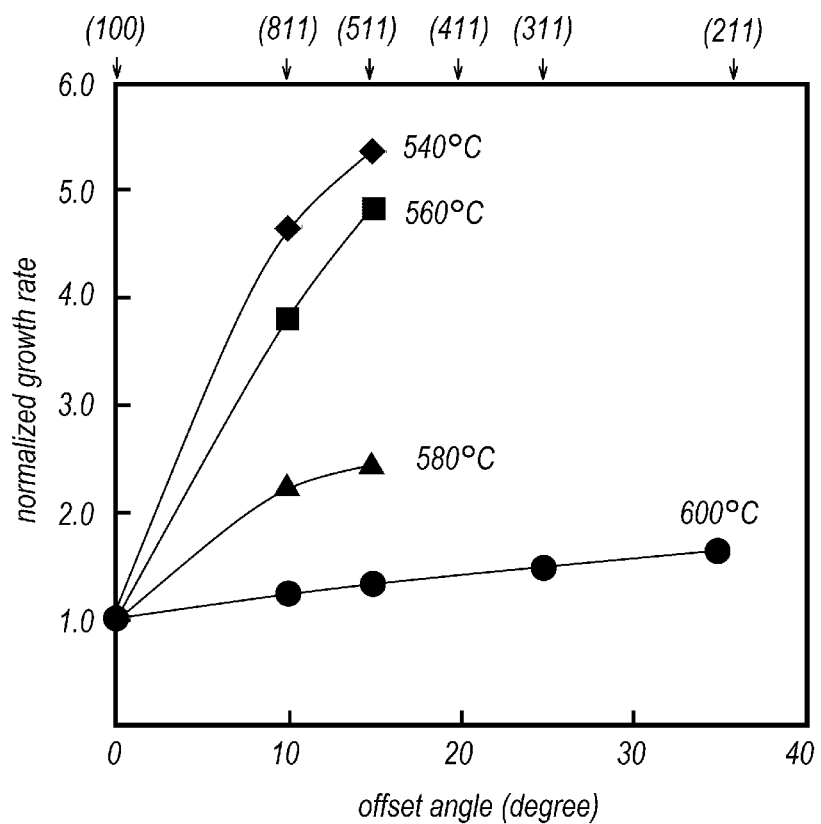
FIG. 7 shows normalized growth rates in various surface orientations of indium phosphide (InP) dependent on temperatures.
Figure 8:
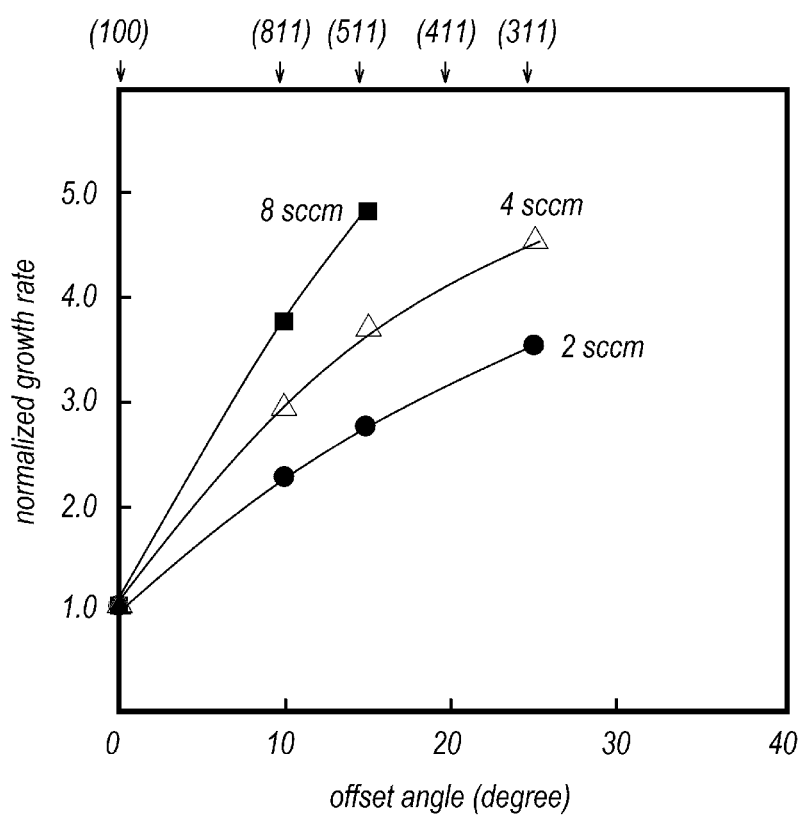
FIG. 8 shows normalized growth rates in various surface orientations of indium phosphide (InP) dependent on flow rates of methyl-chloride ($CH_3Cl$)
Figure 9:
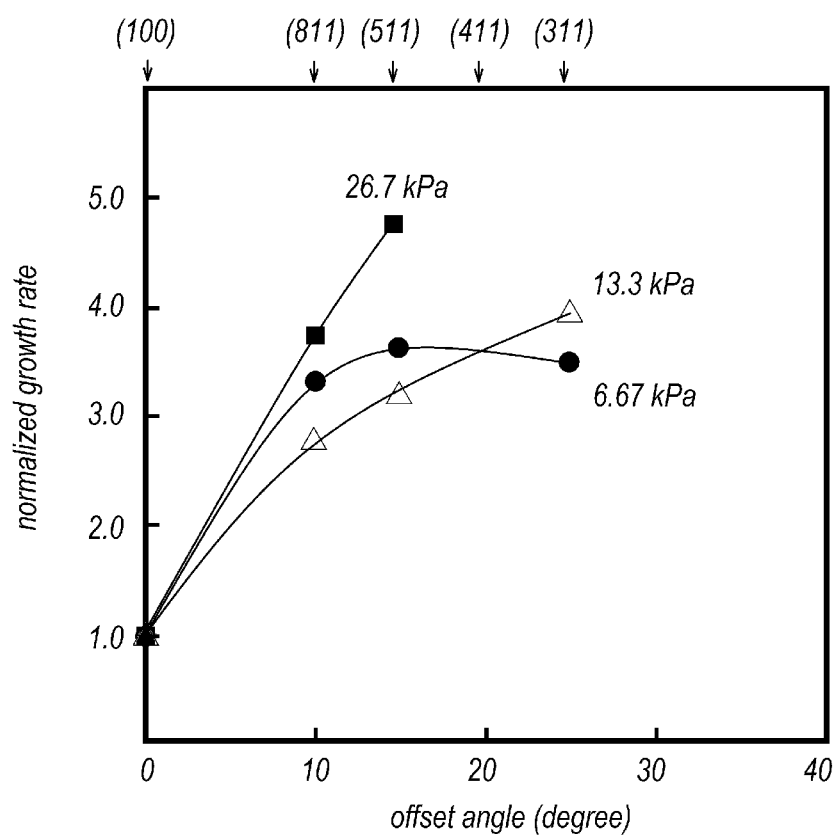
FIG. 9 shows normalized growth rates of in various surface orientations of indium phosphide (InP) dependent on growth pressures.

FIGS. 7 to 9 show growth rates of InP on various surfaces depending on growth temperatures, flow rates of methyl-chloride ($CH_3Cl$), and growth pressures, where the surfaces are denoted by angles measured from the (100) surface and the growth rates are normalized with respect to the growth rate on the (100) surface.

As FIG. 7 indicates, the growth rates become relatively flat, namely, substantially independent of the surface orientations, when the growth temperature becomes higher than 580° C. However, those for the growth temperatures lower than 560° C. strongly depend on the surface orientations. Even a slight increment of the angle with respect to the (100) surface causes a considerable change in the growth rate. For instance, merely 5° increment of the angle results in the growth rate three times faster than that for the (100) surface. Thus, the growth temperature that is lower than 580° C. may effectively form the thinned second burying layer 11 on the first burying layer 9b.

Also as FIG. 8 indicates, the methyl-chloride ($CH_3Cl$) added to source materials for growing InP may enhance the growth rate on surfaces with higher indices compared to those of the (100) surface. The methyl-chloride ($CH_3Cl$) may partially etch InP in the (100) surface thereof during the growth. Accordingly, an increment of the flow rate of methyl-chloride ($CH_3Cl$) may suppress the growth rate of InP on the (100) surface, that is, a difference in the growth rates between the (100) surface and surface with higher indices expands.

FIG. 9 indicates the normalized growth rate on various surfaces with respect to growth pressures. When the growth pressure is lower than 50 Torr (13.3 kPa), the growth rates on surface with higher indices are invariant as keeping a substantial difference against that on the (100) surface. However, increasing the growth pressure, for instance 100 Torr (26.6 kPa) and 200 Torr (53.2 kPa), the growth rates on surfaces with higher indices depend on the angle of the surfaces. Slight increment in the angle against the (100) surface enhances the growth rate. Thus, the growth pressure greater than 13.3 kPa may effectively form the even surface 11c on the surface of the second burying layer 11. As described, a thinner even surface in the second burying layer 11 may reduce resistance of the third cladding layer 13 on the mesa 4 which is narrowed by the second burying layer thinned by the process described above. The second burying layer 11 thinned to 100 nm by the present process may decrease parasitic resistance primarily due to the narrowed portion of the upper cladding layer 13 by 0.49Ω for a device with a cavity length of 150 μm.

Modified Arrangement

Figure 10:
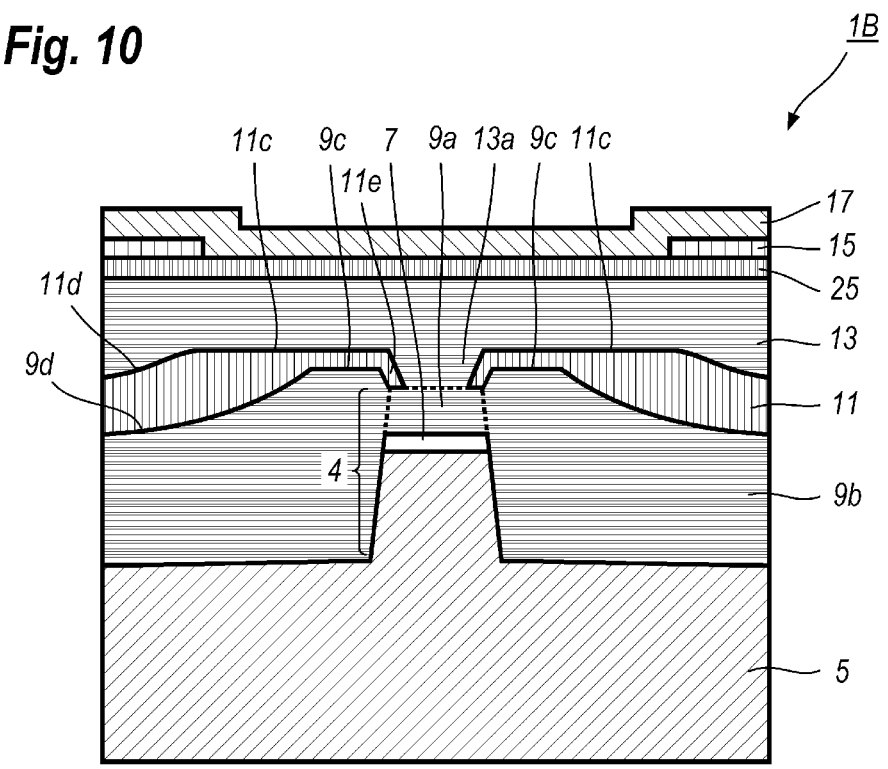
FIG. 10 shows a cross section of a semiconductor optical device modified from the semiconductor optical device shown in FIG. 3.

FIG. 10 shows a cross section of a semiconductor device 1B modified from those of the device 1A shown in FIG. 3. The semiconductor device 1B in the cross section thereof has a feature distinguishable against those shown in FIG. 3 is that the even surface 9c in the top level thereof is formed higher than the level of the top of the mesa 4. However, the second burying layer 11 in FIG. 10 also provides the thinned portion above the even surface 9c of the first burying layer 9b, which is formed by the growing conditions thus described according to the present invention. Thus, the parasitic resistance in the narrowed portion of the third cladding layer 13 on the mesa 4 is effectively reduced.

While particular examples of the present invention have been described herein for purposes of illustration, many modifications and changes will become apparent to those skilled in the art. For instance, the explanation above concentrates on the case where the burying layers are made of InP. However, the present invention, or the spirit of the present invention may be applicable to other materials except for InP. The invention is also applicable to materials in the group II-VI and those in the group III-V except for InP. Accordingly, the appended claims are intended to encompass all such modifications and changes as fall within the true spirit and scope of this invention.

The present application claims the benefit of priority of Japanese Patent Application No. 2016-005432, filed on Jan. 14, 2016, which is incorporated herein by reference.

I claim:

1. A process of forming a semiconductor optical device, comprising steps of:
    forming a mesa that includes a lower cladding layer of a first conduction type, an active layer, and an upper cladding layer of a second conduction type opposite to the first conduction type, the mesa exposing a surface of the lower cladding layer in respective sides thereof;
    burying the mesa by selectively growing a first burying layer with the second conduction type, the first burying layer covering respective sides of the lower cladding layer, the active layer, and the upper cladding layer in the mesa, the first burying layer having an even surface in a side of the mesa and another surface, the even surface having a surface orientation that reflects a surface orientation of the surface of the lower cladding layer exposed in the respective sides of the mesa and the another surface having surface orientations of higher indices with respect to the even surface, the even surface having a level higher than a level of the active layer in the mesa; and growing a second burying layer of the first conduction type as covering the first burying layer under a temperature between 540 to 580° C., the second burying layer having an even surface and another surface, the even surface of the second burying layer overlapping with the even surfaces of the first burying layer and having a surface orientation same with the surface orientation of the even surface of the first burying layer, the second burying layer having a thickness in a portion of the even surface of the first burying layer thinner than another thickness thereof in a portion of the another surface of the first burying layer another surface of the first burying layer, wherein the step of forming the mesa includes steps of:
forming an etching mask in a portion of the upper cladding layer, and
etching the upper cladding layer, the active layer, and a portion of the lower cladding layer in portions of respective sides of the etching mask, and wherein the step of burying the mesa includes a step of:
selectively growing the first burying layer in portions exposed by the etching mask, the even surface of the first burying layer being formed adjacent to the etching mask and the another surface of the first burying layer being formed apart from the etching mask with respect to the etching mask, and narrowing the etching mask before the step of growing the second burying layer.

2. The process of claim 1,
wherein the step of forming the mesa includes steps of:
preparing a substrate with a primary surface thereof having a (100) surface orientation;
growing the lower cladding layer, the active layer, and the upper cladding layer on the primary surface of the substrate, wherein the lower cladding layer in a top surface thereof having a (100) surface orientation; and
removing portions of the lower cladding layer, the active layer, and the upper cladding layer in the respective sides of the mesa for forming the mesa,
wherein the surface of the lower cladding layer exposed in the respective sides of the mesa, the even surface of the first burying layer, and the even surface of the second burying layer have the (100) surface orientation.

3. The process of claim 1,
wherein the step of burying the mesa includes a step of selectively growing the first burying layer such that the even surface of the first burying layer in the level thereof becomes higher than a top level of the mesa.

4. The process of claim 1,
wherein the step of burying the mesa includes a step of selectively growing a semi-insulating semiconductor layer as the first burying layer.

5. The process of claim 1,
wherein the step of growing the second burying layer is carried out under a growth pressure not lower than 13.3 kPa.

6. The process of claim 1,
wherein the step of growing the second burying layer is carried out by supplying methyl-chloride ($CH_3Cl$).

7. A process of forming a semiconductor optical device, comprising steps of:

forming a mesa that includes a lower cladding layer of a first conduction type, an active layer, and an upper cladding layer of a second conduction type opposite to the first conduction type, the mesa exposing a surface of the lower cladding layer in respective sides thereof;

burying the mesa by selectively growing a first burying layer with the second conduction type, the first burying layer covering respective sides of the lower cladding layer, the active layer, and the upper cladding layer in the mesa, the first burying layer having an even surface in a side of the mesa and another surface, the even surface having a surface orientation that reflects a surface orientation of the surface of the lower cladding layer exposed in the respective sides of the mesa and the another surface having surface orientations of higher indices with respect to the even surface, the even surface having a level higher than a level of the active layer in the mesa; and growing a second burying layer of the first conduction type as covering the first burying layer under a temperature between 540 to 580° C., the second burying layer having an even surface and another surface, the even surface of the second burying layer overlapping with the even surfaces of the first burying layer and having a surface orientation same with the surface orientation of the even surface of the first burying layer, the second burying layer having a thickness in a portion of the even surface of the first burying layer thinner than another thickness thereof in a portion of the another surface of the first burying layer, wherein the step of growing the second burying layer includes a step of growing the second burying layer on the another surface of the first burying layer with a growth rate at least four times faster than a growth rate of the second burying layer on the even surface of the first burying layer.

8. The process of claim 7,
wherein the step of forming the mesa includes steps of:
preparing a substrate with a primary surface thereof having a (100) surface orientation;
growing the lower cladding layer, the active layer, and the upper cladding layer on the primary surface of the substrate, wherein the lower cladding layer in a top surface thereof having a (100) surface orientation; and
removing portions of the lower cladding layer, the active layer, and the upper cladding layer in the respective sides of the mesa for forming the mesa,
wherein the surface of the lower cladding layer exposed in the respective sides of the mesa, the even surface of the first burying layer, and the even surface of the second burying layer have the (100) surface orientation.

9. The process of claim 7,
wherein the step of burying the mesa includes a step of selectively growing the first burying layer such that the even surface of the first burying layer in the level thereof becomes higher than a top level of the mesa.

10. The process of claim 7,
wherein the step of burying the mesa includes a step of selectively growing a semi-insulating semiconductor layer as the first burying layer.

11. The process of claim 7,
wherein the step of growing the second burying layer is carried out under a growth pressure not lower than 13.3 kPa.

12. The process of claim 7,
wherein the step of growing the second burying layer is carried out by supplying methyl-chloride (CH3Cl).

13. A process of forming a semiconductor optical device, comprising steps of:
forming a mesa that includes a lower cladding layer of a first conduction type, an active layer, and an upper cladding layer of a second conduction type opposite to the first conduction type, the mesa exposing a surface of the lower cladding layer in respective sides thereof;
burying the mesa by selectively growing a first burying layer with the second conduction type, the first burying layer covering respective sides of the lower cladding layer, the active layer, and the upper cladding layer in the mesa, the first burying layer having an even surface in a side of the mesa and another surface, the even surface having a surface orientation that reflects a surface orientation of the surface of the lower cladding layer exposed in the respective sides of the mesa and the another surface having surface orientations of higher indices with respect to the even surface, the even surface having a level higher than a level of the active layer in the mesa; and
growing a second burying layer of the first conduction type as covering the first burying layer under a temperature between 540 to 580° C., the second burying layer having an even surface and another surface, the even surface of the second burying layer overlapping with the even surfaces of the first burying layer and having a surface orientation same with the surface orientation of the even surface of the first burying layer, the second burying layer having a thickness in a portion of the even surface of the first burying layer thinner than another thickness thereof in a portion of the another surface of the first burying layer,
wherein the second burying layer is made of indium phosphide (InP),
wherein the step of growing the second burying layer includes a step of setting a ratio of a flow rate $F_P$ of phosphide (P) against a flow rate $F_{In}$ of indium (In), $F_P/F_{In}$, to be within a range of 50 to 150.

14. The process of claim 13,
wherein the step of forming the mesa includes steps of:
preparing a substrate with a primary surface thereof having a (100) surface orientation;
growing the lower cladding layer, the active layer, and the upper cladding layer on the primary surface of the substrate, wherein the lower cladding layer in a top surface thereof having a (100) surface orientation; and
removing portions of the lower cladding layer, the active layer, and the upper cladding layer in the respective sides of the mesa for forming the mesa,
wherein the surface of the lower cladding layer exposed in the respective sides of the mesa, the even surface of the first burying layer, and the even surface of the second burying layer have the (100) surface orientation.

15. The process of claim 13,
wherein the step of burying the mesa includes a step of selectively growing the first burying layer such that the even surface of the first burying layer in the level thereof becomes higher than a top level of the mesa.

16. The process of claim 13,
wherein the step of burying the mesa includes a step of selectively growing a semi-insulating semiconductor layer as the first burying layer.

17. The process of claim 13,
wherein the step of growing the second burying layer is carried out under a growth pressure not lower than 13.3 kPa.

18. The process of claim 13,
wherein the step of growing the second burying layer is carried out by supplying methyl-chloride (CH3Cl).

* * * * *